(12) United States Patent
Murai et al.

(10) Patent No.: US 10,580,799 B2
(45) Date of Patent: Mar. 3, 2020

(54) THIN FILM TRANSISTOR AND DISPLAY DEVICE COMPRISING THE SAME

(71) Applicant: JOLED Inc., Tokyo (JP)

(72) Inventors: Atsuhito Murai, Tokyo (JP); Eiichi Sato, Tokyo (JP); Masanori Miura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/186,590

(22) Filed: Nov. 12, 2018

(65) Prior Publication Data

US 2019/0081083 A1 Mar. 14, 2019

Related U.S. Application Data

(62) Division of application No. 15/459,634, filed on Mar. 15, 2017, now Pat. No. 10,192,891.

(30) Foreign Application Priority Data

Mar. 16, 2016 (JP) ................. 2016-052693

(51) Int. Cl.
*H01L 27/12* (2006.01)
*H01L 51/52* (2006.01)
(Continued)

(52) U.S. Cl.
CPC ........ *H01L 27/1225* (2013.01); *G02F 1/1368* (2013.01); *H01L 27/124* (2013.01);
(Continued)

(58) Field of Classification Search
CPC ............. H01L 27/1214; H01L 27/1222; H01L 27/1225; H01L 27/1237; H01L 27/1244;
(Continued)

(56) References Cited

U.S. PATENT DOCUMENTS

2011/0240998 A1  10/2011  Morosawa et al.
2012/0001167 A1   1/2012  Morosawa
(Continued)

FOREIGN PATENT DOCUMENTS

JP   2011-228622 A   11/2011
JP   2012-015436 A    1/2012
(Continued)

OTHER PUBLICATIONS

Office Action in JP Application No. 2016-052693, dated Oct. 2, 2018, 8pp.

*Primary Examiner* — Thanhha S Pham
(74) *Attorney, Agent, or Firm* — Hauptman Ham, LLP

(57) ABSTRACT

According to one embodiment, a thin film transistor includes an oxide semiconductor layer provided above an insulating substrate and including a channel region between a source region and a drain region, a first insulating film provided in a region on the oxide semiconductor layer, which corresponds to the channel region, a gate electrode provided on the first insulating film, a first protective film provided on the oxide semiconductor layer, the first insulating film and the gate electrode, as an insulating film containing a metal, a second protective film provided on the first protective film and a third protective film provided on the second protective film, as an insulating film containing a metal.

14 Claims, 9 Drawing Sheets

(51) Int. Cl.
  *H01L 27/32* (2006.01)
  *H01L 29/786* (2006.01)
  *H01L 29/417* (2006.01)
  *G02F 1/1368* (2006.01)

(52) U.S. Cl.
  CPC ...... *H01L 27/1248* (2013.01); *H01L 27/1251* (2013.01); *H01L 27/3258* (2013.01); *H01L 27/3262* (2013.01); *H01L 27/3276* (2013.01); *H01L 29/41733* (2013.01); *H01L 29/786* (2013.01); *H01L 29/7869* (2013.01); *H01L 29/78666* (2013.01); *H01L 29/78675* (2013.01); *H01L 51/5253* (2013.01); *H01L 51/5256* (2013.01)

(58) Field of Classification Search
  CPC ............ H01L 27/1248; H01L 29/7866; H01L 27/17251; H01L 27/1251; H01L 29/786; H01L 29/78669; H01L 29/78678; H01L 51/5253; H01L 51/5256; H01L 27/36258; H01L 27/124
  See application file for complete search history.

(56) References Cited

U.S. PATENT DOCUMENTS

| | | | |
|---|---|---|---|
| 2012/0276694 A1* | 11/2012 | Koezuka | H01L 29/7869 438/151 |
| 2013/0153893 A1 | 6/2013 | Morosawa et al. | |
| 2013/0203214 A1 | 8/2013 | Isobe et al. | |

FOREIGN PATENT DOCUMENTS

| | | |
|---|---|---|
| JP | 2013-183111 A | 9/2013 |
| JP | 2016-25100 A | 2/2016 |

* cited by examiner

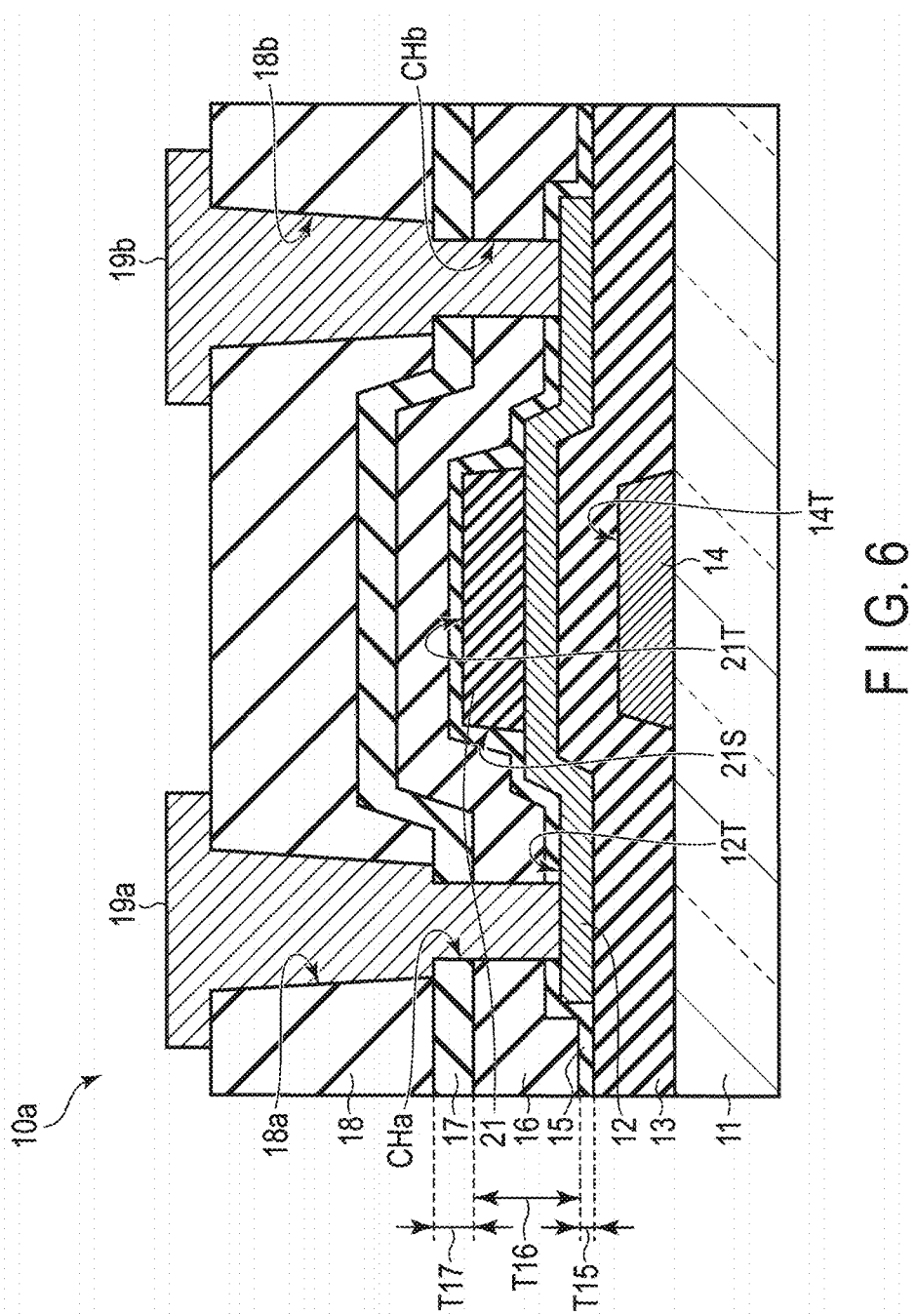
F I G. 6

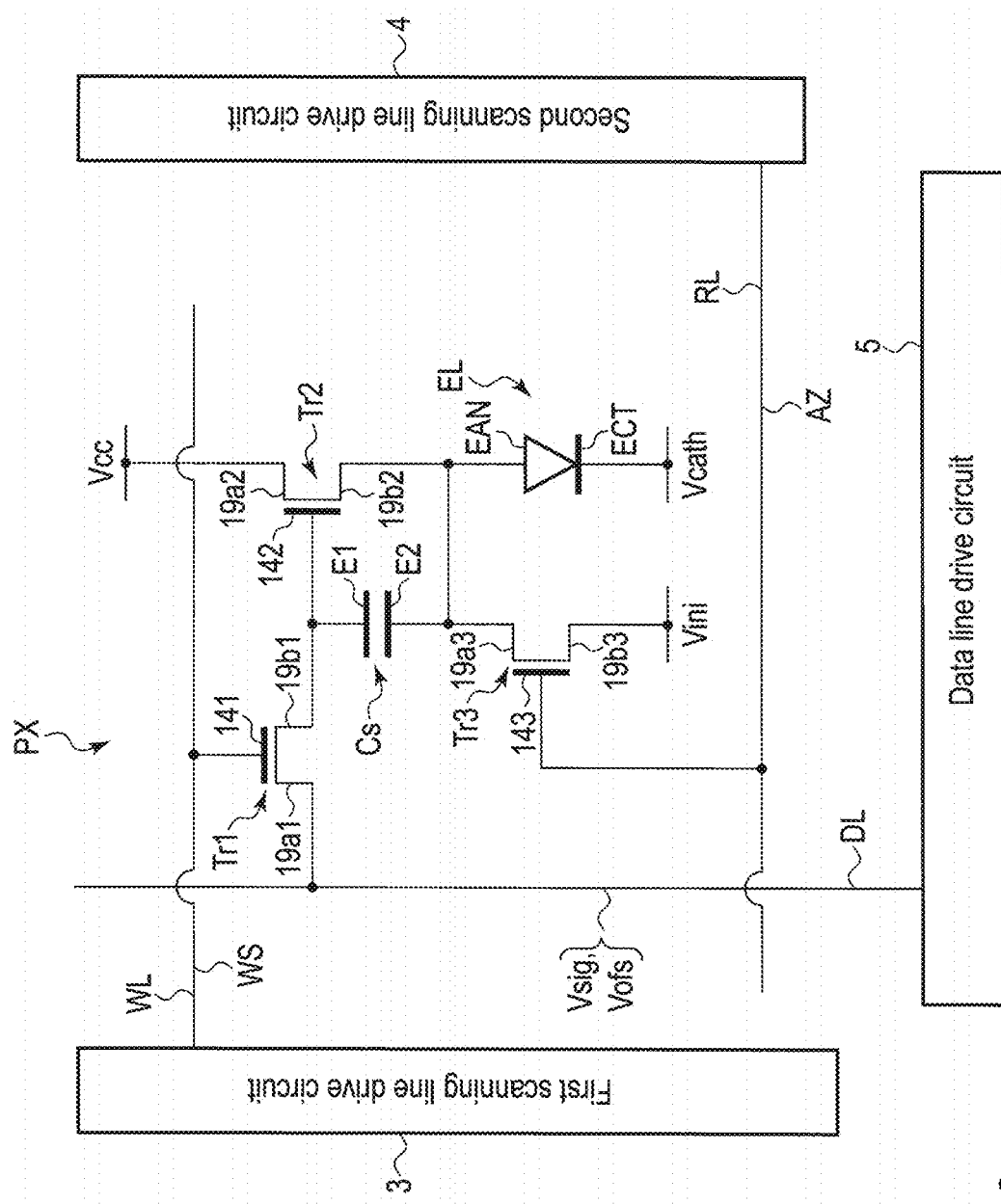
F I G. 8

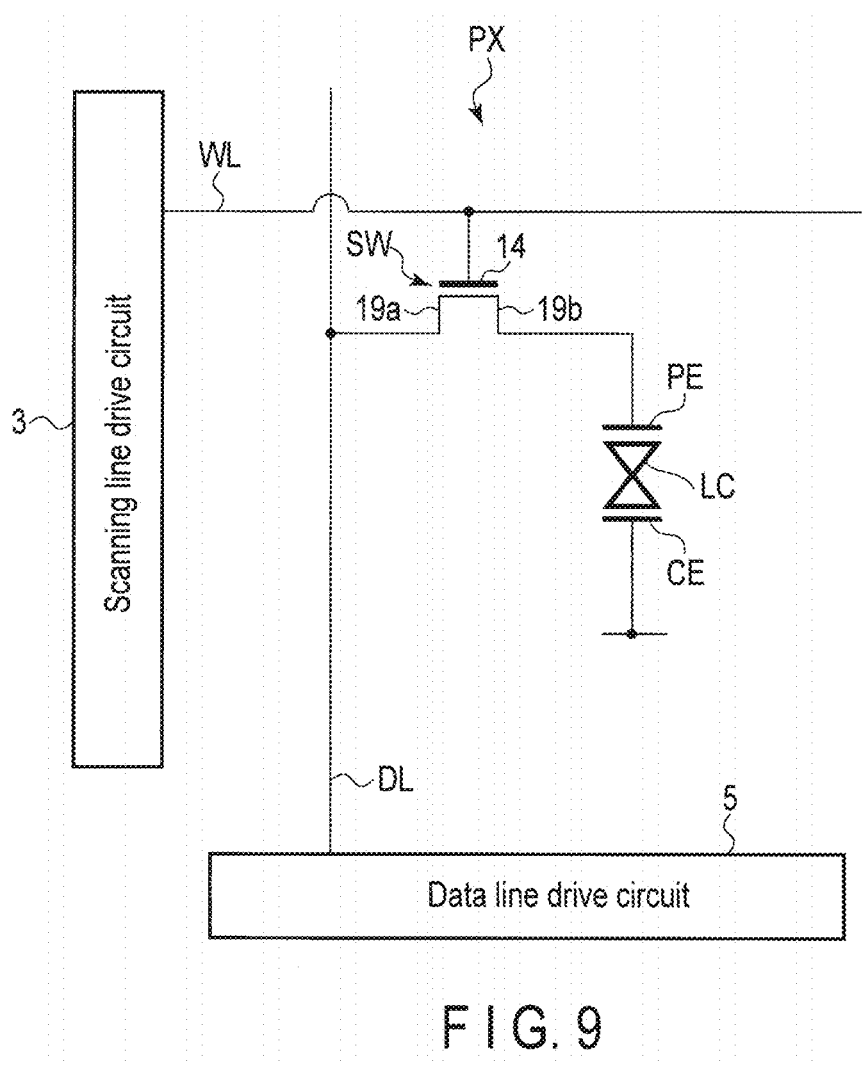
F I G. 9

THIN FILM TRANSISTOR AND DISPLAY DEVICE COMPRISING THE SAME

CROSS-REFERENCE TO RELATED APPLICATIONS

The present application is a divisional application of U.S. patent application Ser. No. 15/459,634, filed on Mar. 15, 2017, which claims priority to Japanese Patent Application No. 2016-052693 filed Mar. 16, 2016. The entire disclosures of the above-listed prior-filed applications are hereby incorporated by reference herein.

FIELD

Embodiments described herein relate generally to a thin film transistor comprising an oxide semiconductor layer and a display device comprising the thin film transistor.

BACKGROUND

Thin film transistors comprising an oxide semiconductor layer have been developed. Such thin film transistors are employed in displays, for example, of televisions, personal computers, smartphones, tablet computers, etc., as switching elements which control the pixels.

In the thin film transistors comprising the oxide semiconductor layer, the carrier density in the semiconductor layer changes if the semiconductor layer is brought into contact with moisture and hydrogen. As a result, the electrical characteristics of the thin film transistor deteriorate. On the other hand, when, for example, a protective film which protects the semiconductor layer is provided to inhibit the semiconductor layer from being brought into contact with moisture and hydrogen, the processing of the thin film transistor may become complicated.

BRIEF DESCRIPTION OF THE DRAWINGS

FIG. 6 is a cross section schematically showing an example of a thin film transistor according to the second embodiment.

FIG. 8 is a circuit diagram schematically showing an example of a pixel shown in FIG. 7.

FIG. 9 is a circuit diagram schematically showing an example of a pixel in a liquid crystal display.

DETAILED DESCRIPTION

Figure 1:
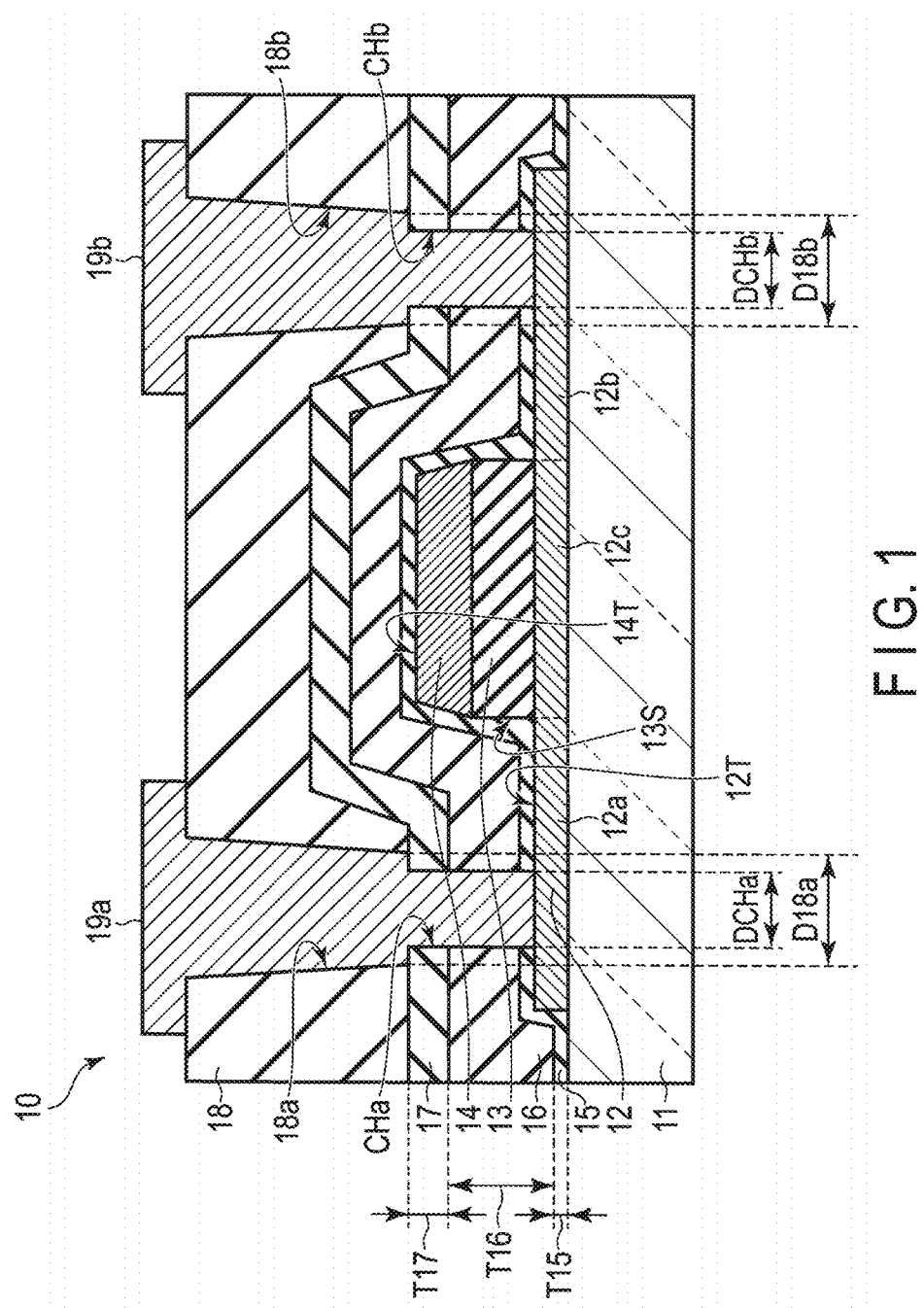
FIG. 1 is a cross section schematically showing an example of a thin film transistor according to the first embodiment.

In general, according to one embodiment, a display device comprises includes an oxide semiconductor layer provided above an insulating substrate and including a source region, a drain region and a channel region between the source region and the drain region, a first insulating film provided in a region on the oxide semiconductor layer, which corresponds to the channel region, a gate electrode provided on the first insulating film, a first protective film provided on the oxide semiconductor layer, the first insulating film and the gate electrode, as an insulating film containing a metal, a second protective film provided on the first protective film and a third protective film provided on the second protective film, as an insulating film containing a metal.

According to one embodiment, a display device comprises a gate electrode provided above an insulating substrate, a first insulating film provided on the gate electrode and the insulating substrate, an oxide semiconductor layer provided on the first insulating film, a second insulating film provided in a region on the oxide semiconductor layer, which corresponds to the gate electrode, a first protective film provided on the oxide semiconductor layer and the second insulating film, as an insulating film containing a metal, a second protective film provided on the first protective film and a third protective film provided on the second protective film, as an insulating film containing a metal.

According to one embodiment, a thin film transistor comprises an oxide semiconductor layer provided above an insulating substrate, a first protective film provided on the oxide semiconductor layer and formed of a metal oxide, a first insulating film provided on the first protective film, a second protective film provided on the first insulating film and formed of a metal oxide, a second insulating film provided on the second protective film and a pair of electrodes provided on the second insulating film, and formed through the second insulating film, the second protective film, the first insulating film and the first protective film, to be electrically connected to the oxide semiconductor layer, wherein the first protective film is in contact with the oxide semiconductor layer, the first insulating film is in contact with the first protective film and the second protective film, and the pair of electrodes are in contact with the first protective film, the first insulating film and the second protective film.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

(First Embodiment)

FIG. 1 is a cross section schematically showing an example of a thin film transistor 10 according to this embodiment. The thin film transistor 10 is, for example, an n-type top-gate thin film transistor.

An oxide semiconductor layer (to be referred to also as a semiconductor layer hereinafter) 12 is formed on an insulating substrate 11 which is formed from, for example, an insulating material such as glass or resin. The semiconductor layer 12 includes source/drain regions 12a and 12b, and a channel region 12c provided between the source/drain regions 12a and 12b.

The semiconductor layer 12 is formed from, for example, an oxide semiconductor such as indium-gallium-zinc oxide (IGZO). Note that the material of the semiconductor layer 12 should only include at least one of, for example, indium (In), gallium (Ga) and tin (Sn), examples of which are oxide semiconductors such as indium-gallium oxide (IGO), indium-zinc oxide (IZO), zinc-tin oxide (ZnSnO) and zinc oxide (ZnO).

On the channel regions 12c of the semiconductor layer 12, a gate insulating film (first insulating film) 13 formed of, for example, silicon oxide (SiO) is formed. On the gate insulating film 13, a gate electrode 14 is formed.

On the insulating substrate 11, a first protective film (first metal oxide layer) 15 is formed to cover the semiconductor layer 12, the gate insulating film 13 and the gate electrode 14. The first protective film 15 is in contact with an upper surface 12T of the semiconductor layer 12, a side surface 13S of the gate insulating film 13 and an upper surface 14T of the gate electrode 14. In the example illustrated, the first protective film 15 is in contact also with the insulating substrate 11. The first protective film 15 is formed from an insulating material of, for example, a metal oxide such as aluminum oxide ($Al_2O_3$). The first protective film 15 may be formed of, besides aluminum oxide, for example, titanium oxide, erbium oxide or the like. The first protective film 15 inhibits the channel regions 12c of the thin film transistor 10 from being in contact with moisture and hydrogen. A thickness T15 of the first protective film 15 is, for example, 5 to 30 nm.

On the first protective film 15, a second protective film (inorganic insulating layer) 16 formed of, for example, an inorganic insulating material containing silicon such as silicon oxide (SiO), silicon nitride (SiN) or silicon oxynitride (SiON). The second protective film 16 functions as an etching stopper of a third protective film 17 while forming contact holes in which source/drain electrodes are to be embedded, as will be described later. A thickness T16 of the second protective film 16 is greater than that of the first protective film 15, which is, for example, 50 to 300 nm. Note that as long as it can function as an etching stopper, the thickness of the second protective film 16 is not limited to the above numerical value, but can be changed as needed. In the example illustrated, the thickness T16 is defined as the thickness of the second protective film 16 in the region where the semiconductor layer 12 is not formed.

On the second protective film 16, a third protective film (second metal oxide layer) 17 is formed. The third protective film 17 is formed of, for example, aluminum oxide ($Al_2O_3$). The third protective film 17 may be formed of, besides aluminum oxide, for example, titanium oxide, erbium oxide or the like. The third protective film 17 inhibits the channel regions 12c of the thin film transistor 10 from being brought into contact with moisture and hydrogen. A thickness T17 of the third protective film 17 is greater than that of the first protective film 15 and is, for example, 30 to 100 nm.

On the third protective film 17, an interlayer insulating film 18 is formed. The interlayer insulating film 18 is formed from, for example, an organic insulating material such as polyimide or acryl.

In the first to third protective films 15 to 17, contact holes CHa and CHb which at least partially expose the source/drain regions 12a and 12b are formed. In the interlayer insulating film 18, contact holes 18a and 18b are formed to correspond to the contact holes CHa and CHb, respectively, and diameters D18a and D18b of the contact holes 18a and 18b are larger than diameters DCHa and DCHb of the contact holes CHa and CHb, respectively. Source/drain electrodes (a pair of electrodes) 19a and 19b provided on the interlayer insulating film 18 are buried also in the contact holes 18a and 18b and CHa and CHb and are connected to the source/drain regions 12a and 12b. That is, the source electrode 19a is in contact with the source region 12a, the first protective film 15, the second protective film 16 and the third protective film 17 in the contact hole CHa, and is in contact with the interlayer insulating film 18 in the contact hole 18a. The drain electrode 19b is in contact with the drain region 12b, the first protective film 15, the second protective film 16 and the third protective film 17 in the contact hole CHb, and is in contact with the interlayer insulating film 18 in the contact hole 18b.

Next, a method of manufacturing the thin film transistor 10 will be described with reference to FIGS. 2A to 5B.

Figure 2A:
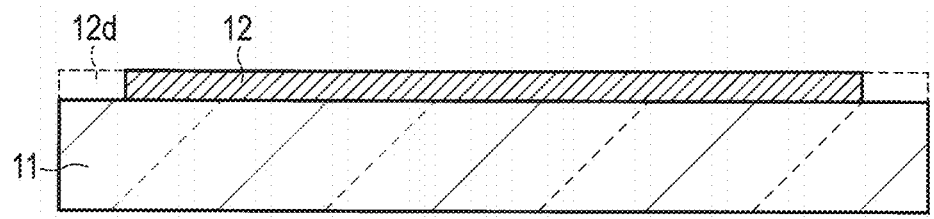
FIG. 2A is a cross section showing an example of a method of manufacturing the thin film transistor shown in FIG. 1.

As shown in FIG. 2A, an oxide semiconductor layer 12d containing at least one of, for example, indium (In), gallium (Ga) and tin (Sn) is formed on the insulating substrate 11 using a sputtering method. Subsequently, the resultant is subjected to lithography, and then etched to form the island-like semiconductor layer 12.

Figure 2B:
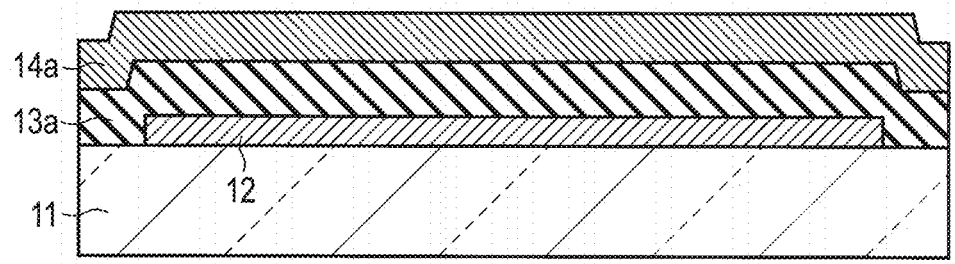
FIG. 2B is a cross section showing a manufacturing step which follows that of FIG. 2A.

Next, as shown in FIG. 2B, a silicon oxide film 13a is formed on the insulating substrate 11 to cover the semiconductor layer 12 using, for example, chemical vapor deposition (CVD). Subsequently, on the silicon oxide film 13a, a metallic film 14a is formed using, for example, the sputtering method. The metallic film 14a is formed from, for example, a layered structure of titanium, aluminum and molybdenum nitride. Note the metallic film 14a may be formed from an alloy of aluminum (Al), copper (Cu), an alloy of copper, or the like.

Figure 2C:
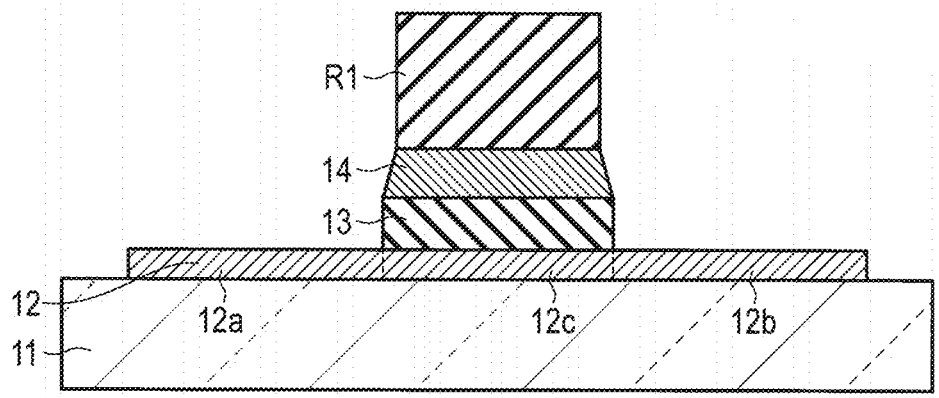
FIG. 2C is a cross section showing a manufacturing step which follows that of FIG. 2B.

Next, on the metallic film 14a, a resist layer R1 is formed so as to be patterned to correspond approximately to the center of the semiconductor layer 12 as shown in FIG. 2C. Subsequently, the resultant is subjected to, using the resist layer R1 as a mask, dry etching with, for example, a $Cl_2$- or $BCl_3$-based gas and then to wet etching with a phosphoric acid/nitric acid/hydrochloric acid-based etchant, thereby forming the gate electrode 14. Subsequently, the silicon oxide film 13a is etched by dry etching with, for example, a $CF_4/O_2$- or $SF_6/O_2$-based gas, thereby forming the gate insulating film 13.

During this process, in the region where the gate electrode 14 and the gate insulating film 13 are not formed, the semiconductor layer 12 is over-etched. In the over-etched region of the semiconductor layers 12, oxygen-vacancy defects are created and thus the source/drain regions 12a and 12b whose resistances are lowered are formed. Moreover, in the region which is not over-etched in the semiconductor layers 12, i.e., the region covered by the gate insulating film 13, the channel region 12c whose high resistance is retained is formed.

Figure 3A:
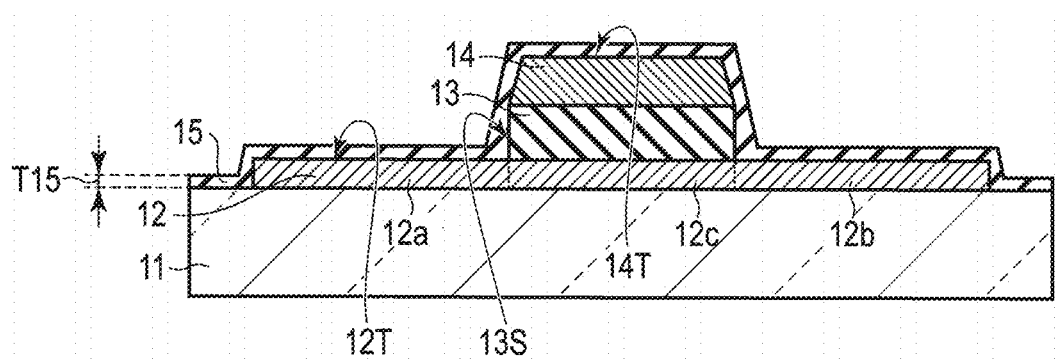
FIG. 3A is a cross section showing a manufacturing step which follows that of FIG. 2C.

Next, as shown in FIG. 3A, the first protective film 15 formed of, for example, aluminum oxide is formed all over the insulating substrate 11 using, for example, the sputtering method. An upper surface 12T (that is, the source/drain regions 12a and 12b) of the semiconductor layer 12, a side surface 13S of the gate insulating film 13 and an upper surface 14T of the gate electrode 14 are covered by the first protective film 15. The thickness T15 of the first protective film 15 is, for example, 10 nm. Here, the resistance of the source/drain regions 12a and 12b, which is lowered by over-etching in the dry etching of the gate insulating film 13, is unstable and therefore the variation in resistance easily occurs by heat or the like. However, with the first protective film 15 formed of an aluminum oxide film, this embodiment can exhibit an advantageous effect of stabilizing the low resistance state.

Figure 3B:
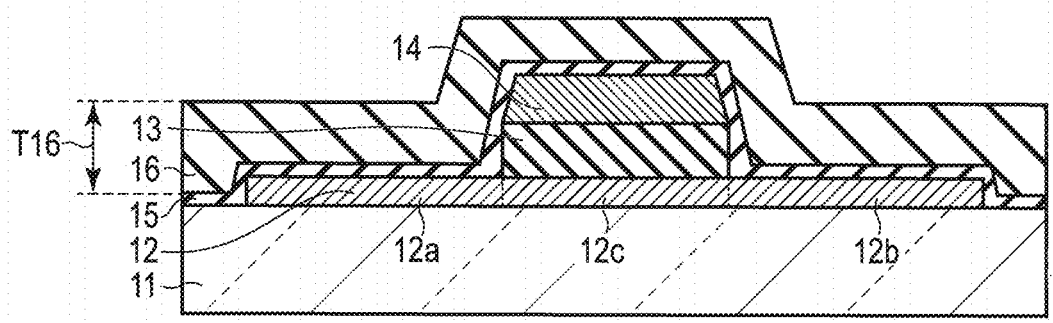
FIG. 3B is a cross section showing a manufacturing step which follows that of FIG. 3A.

Next, as shown in FIG. 3B, the second protective film 16 of, for example, silicon oxide is formed on the first protective film 15 using, for example, CVD. The thickness T16 of the second protective film 16 is, for example, 100 nm.

Figure 3C:
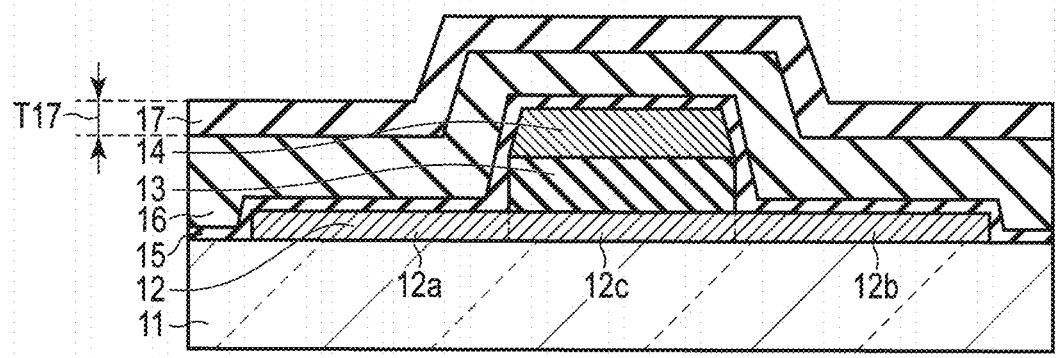
FIG. 3C is a cross section showing a manufacturing step which follows that of FIG. 3B.

Next, as shown in FIG. 3C, the third protective film 17 of, for example, aluminum oxide is formed on the second protective film 16 using, for example, the sputtering method. The third protective film 17 has the thickness T17 greater than that of the first protective film 15. The thickness T17 of the third protective film 17 is, for example, 50 nm.

Figure 4A:
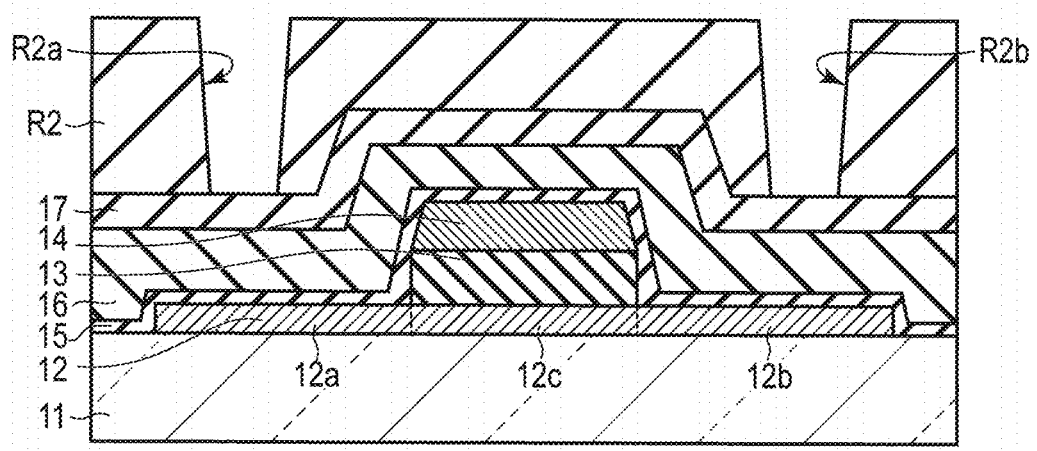
FIG. 4A is a cross section showing a manufacturing step which follows that of FIG. 3C.

Next, on the third protective film 17, a resist layer R2 is formed, as shown in FIG. 4A. The resist layer R2 is subjected to photolithography to include the opening R2a and R2b which expose the third protective film 17 so as to correspond to the source/drain regions 12a and 12b.

Figure 4B:
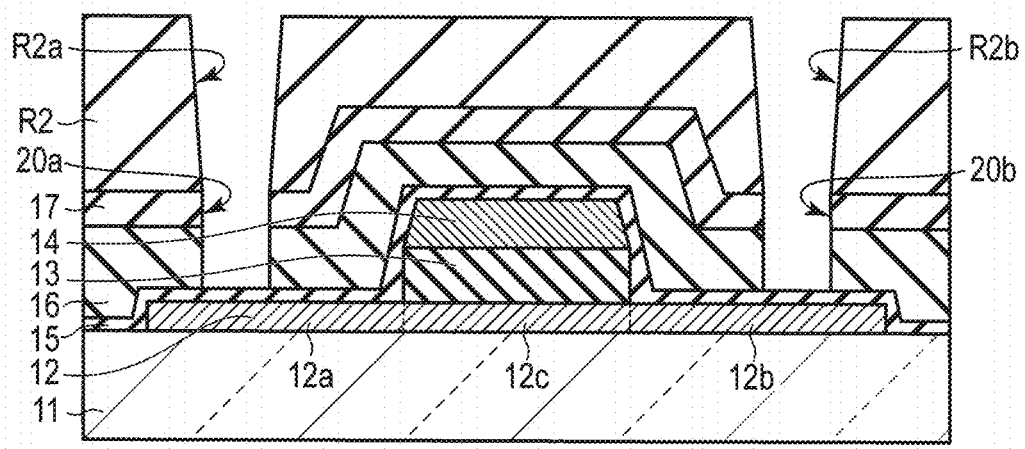
FIG. 4B is a cross section showing a manufacturing step which follows that of FIG. 4A.

Next, as shown in FIG. 4B, the third protective film 17 is etched by dry etching with, for example, a $Cl_2$-based gas using the resist layer R2 as a mask. Subsequently, the second protective film 16 is etched by dry etching with a $CF_4$-based gas. Thus, the contact holes 20a and 20b which expose the first protective film 15 are formed in the third protective film 17 and the second protective film 16.

Figure 5A:
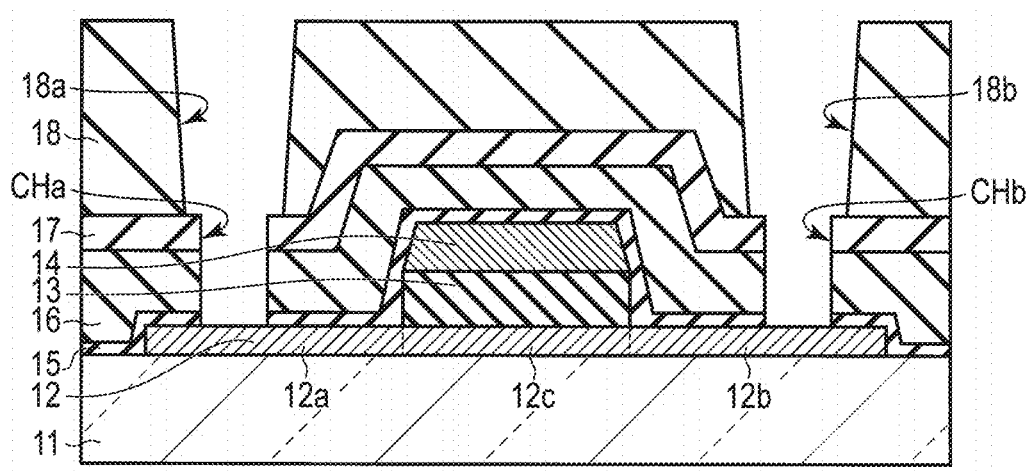
FIG. 5A is a cross section showing a manufacturing step which follows that of FIG. 4B.

Next, the resist layer R2 is removed, and thereafter the interlayer insulating film 18 of an organic insulating material having photosensitivity is formed on the third protective film 17 as shown in FIG. 5A. Subsequently, in the interlayer insulating film 18, the contact holes 18a and 18b are formed to correspond to the contact holes 20a and 20b, respectively by lithography, and the diameters D18a and D18b of the contact holes 18a and 18b are larger than the diameters D20a and D20b of the contact holes 20a and 20b, respectively. Then, the first protective film 15 is subjected to dry etching using the interlayer insulating film 18 as a mask. Thus, the contact holes CHa and CHb are formed through to the source/drain regions 12a and 12b.

Figure 5B:
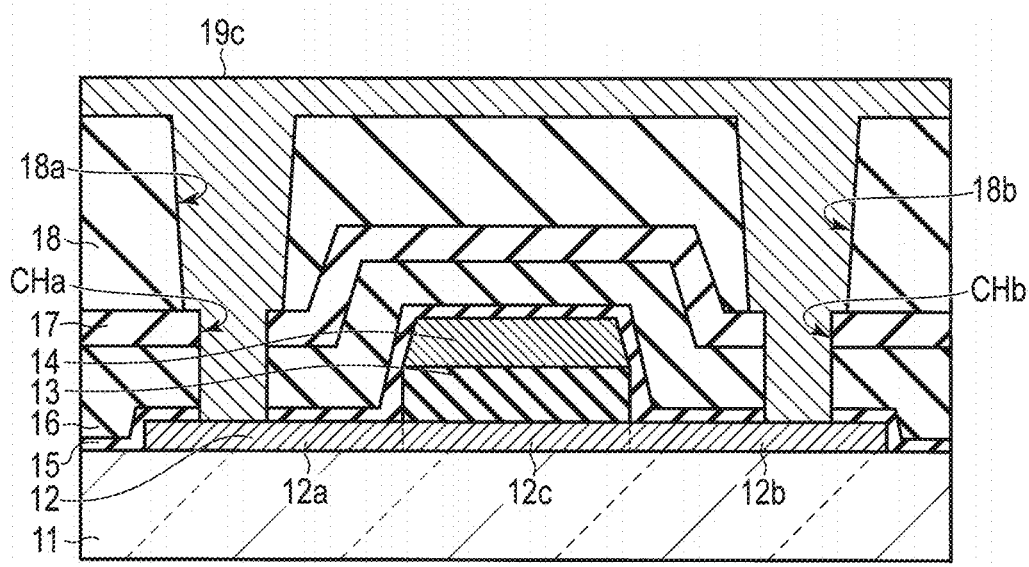
FIG. 5B is a cross section showing a manufacturing step which follows that of FIG. 5A.

Next, as shown in FIG. 5B, on the interlayer insulating film 18, a metallic film 19c formed from a layered structure of, for example, molybdenum, aluminum and molybdenum nitride is formed by the sputtering method to bury the contact holes 18a and 18b and CHa and CHb. Subsequently, lithography is carried out, and then the resultant is subjected to wet etching with a phosphoric acid/nitric acid/hydrochoric acid-based etchant, thereby forming the source drain electrodes 19a and 19b shown in FIG. 1. Thus, the thin film transistor 10 is formed.

According to this embodiment, the semiconductor layer 12, the gate insulating film 13 and the gate electrode 14 are covered by the first to third protective films 15, 16 and 17 and further, the third protective film 17 is sufficiently thicker than the first protective film 15. With this structure, it is possible to inhibit moisture and hydrogen from entering to the channel region 12c. Moreover, even if a defect such as a crack is created in the first protective film 15, the third protective film 17 can inhibit the entering of moisture and hydrogen to the channel regions 12c. Thus, the change in carrier density of the channel regions 12c can be suppressed and therefore, the characteristics of the thin film transistor can be stabilized.

Moreover, the first and third protective films 15 and 17 are formed of, for example, aluminum oxide, and the second protective film 16 provided between the first protective film 15 and the third protective film 17 is formed from an inorganic insulating material containing, for example, a silicon such as silicon oxide, silicon nitride or silicon oxynitride. Therefore, when the third protective film 17 is formed on the second protective film 16, the step coverage of the third protective film 17 can be improved. Further, the second protective film 16 provided between the first protective film 15 and the third protective film 17 functions as an etching stopper, processing of the third protective film 17 to be formed on the second protective film 16 is facilitated.

The reason for the above-described effect will be described.

For example, it may be possible to suppress the change in carrier density of the channel region 12c while stabilizing the resistance of the source/drain regions 12a and 12b, which are lowered by providing, in place of the three-layered structure of the first to third protective films 15 to 17, only the first protective film 15 but which is formed thick as, for example, 50 nm. However, generally, aluminum oxide is a stable oxide and has low dry etching rate, and so if the first protective film 15 is formed thick, the over-etching time in the dry etching process is prolonged. As a result, the contact holes Cha and CHb, the source/drain regions 12a and 12b underlying the first protective film 15 are greatly damaged. At the worst, the film of the source/drain regions is destroyed, which may result in poor characteristics of the transistor. By contrast, with the three-layered structure of the present invention, the second protective film 16 can function as an etching stopper when the third protective film 17 is dry-etched, and therefore the thickness T17 of the third protective film 17 can be increased.

Consequently, there is no need to form the first protective film 15 to be thick, but it can be made thin, and therefore the time required for the etching can be shortened. Therefore, it is possible to suppress the damage, which may be caused to the source/drain regions 12a and 12b underlying the first protective film 15 during the etching thereof.

Further, with the first protective film 15 of aluminum oxide formed on the semiconductor layer 12, it is possible to inhibit hydrogen contained in the source gas such as silane ($SiH_4$) from diffusing to the channel regions 12c while forming the second protective film 16. On the other hand, when the first protective film 15 of aluminum oxide is formed, the carrier density of the channel regions 12c cannot be changed easily since hydrogen is not contained in the source gas. Therefore, by forming the first protective film 15 of aluminum oxide on the semiconductor layer 12, the reliability of the thin film transistor can be improved.

Moreover, the first protective film 15 is formed by sputtering aluminum oxide. Here, when an aluminum oxide film formed by heat-treating an aluminum film formed by, for example, the sputtering method is used as the first protective film 15, the resistance of the source/drain regions 12a and 12b may be increased by heat treatment and the carrier density may be changed by extraction of oxygen from the channel regions 12c. By contrast, since the first protective film 15 of this embodiment does not need the application of heat and also is formed as a film of aluminum oxide which is an oxide. Therefore, it is possible to inhibit the extraction of oxygen from the channel region 12c.

Therefore, according to this embodiment, the characteristics of the thin film transistor can be stabilized and the reliability can be improved. Further, the manufacturing process can be facilitated, thereby improving the yield.

(Second Embodiment)

FIG. 6 is a cross section schematically showing a thin film transistor 10a according to the second embodiment. The second embodiment is directed to a bottom-gate thin film transistor.

A gate electrode 14 is formed on an insulating substrate 11. A gate insulating film (first insulating film) 13 is formed on the insulating substrate 11 so as to cover the gate electrode 14. That is, the gate insulating film 13 is in contact with the insulating substrate 11 and an upper surface 14T of the gate electrode 14. A semiconductor layer 12 is formed on the gate insulating film 13. In a region of the semiconductor layer 12, which corresponds to the gate electrode 14, that is, a region directly above the channel region 12c, a channel protection film (second insulating film) 21 of, for example, silicon oxide is formed.

The first to third protective films 15 to 17 are formed on the semiconductor layer 12 and the channel protection film 21. More specifically, the first protective film (first metal oxide layer) 15 is in contact with an upper surface 12T of the semiconductor layer 12, a side surface 21S and upper surface 21T of the channel protection film 21. In the example illustrated, the first protective film 15 is in contact also with the gate insulating film 13. The second protective film (inorganic insulating layer) 16 is formed on the first protective film 15. The third protective film (second metal oxide layer) 17 is formed on the second protective film 16. The material and the thickness T15 to T17 of the first to third protective films 15 to 17 are similar to those of the first embodiment. The other structure is similar to that of the first embodiment.

According to the second embodiment, the first protective film 15 covers only the semiconductor layer 12 and the channel protection film 21. On the other hand, in the case of the top-gate thin film transistor, the first protective film 15 covers the semiconductor layer 12, the gate insulating film 13 and the gate electrode 14. Therefore, the height of the step portion to be covered by the first protective film 15 is less as compared to the first embodiment, the step coverage of the first to third protective films 15 to 17 can be improved.

Note that the first and second embodiments provided above are described in connection with an example case where the three-layered protective film of the first to third protective films 15 16, and 17 is formed above the semiconductor layer 12 which constitutes the thin film transistor, but it suffices if the protective film includes at least three layers. For example, a fourth protective film may be provided on the third protective film 17, or a fifth protective film may be provided on the fourth protective film. When a further protective film is provided on the third protective film 17, the material of the second protective film 16 is not limited to the examples described above. That is, when a further protective film is provided on the third protective film 17, the second protective film 16 may be formed of, for example, aluminum oxide, titanium oxide, erbium oxide, or the like.

(Applied Example)

Figure 7:
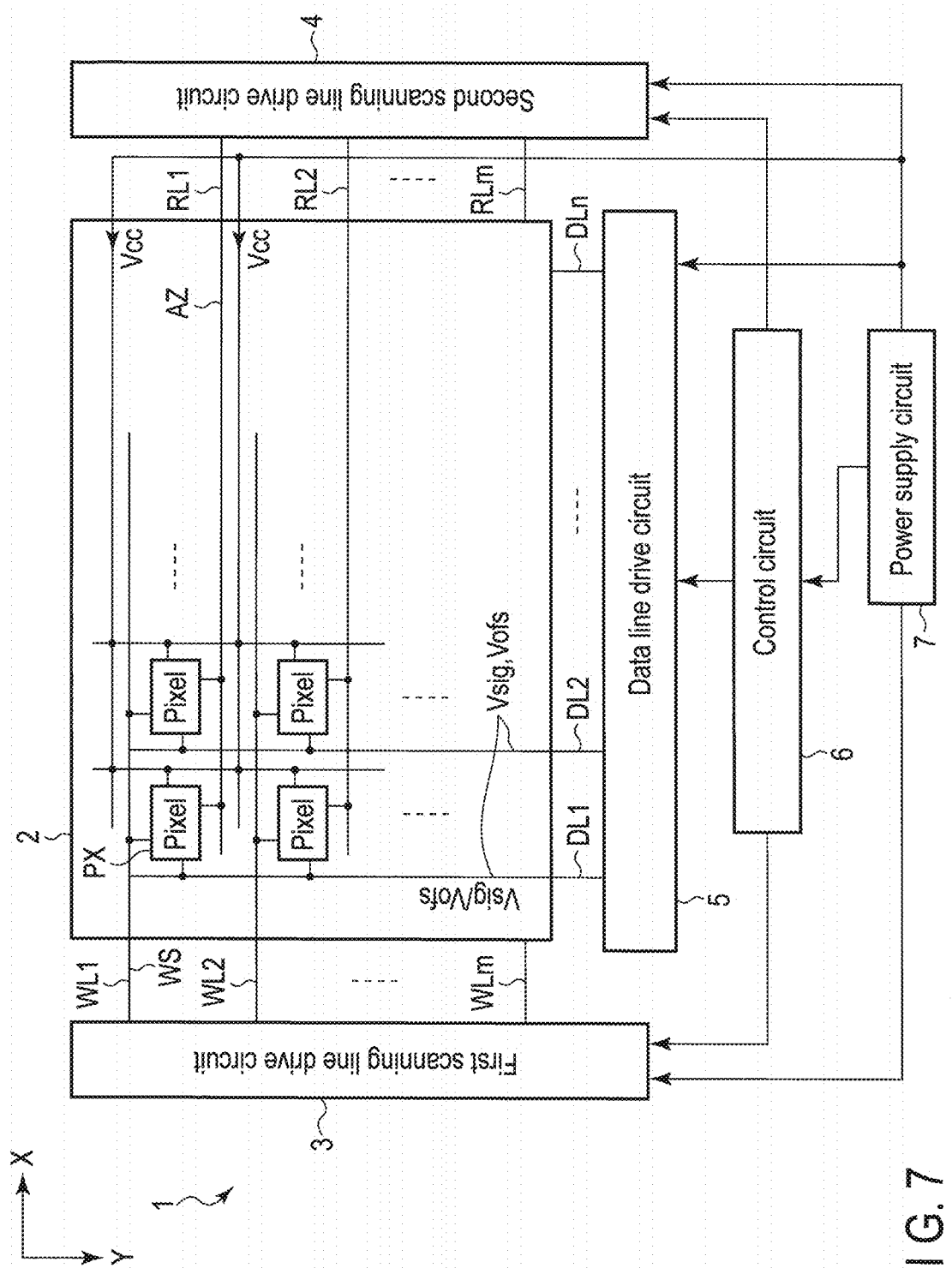
FIG. 7 is a circuit diagram schematically showing an example of a display device to which the thin film transistor according to the first or second embodiment is applied.

FIG. 7 is a circuit diagram schematically showing an example of a display device 1 to which the thin film transistors 10 or 10a according to the first or second embodiment is applied. The display device 1 is an active-matrix display device which employs, for example, an organic electroluminescence (EL) element.

The display device 1 comprises a display area 2 and drivers provided in a periphery of the display area 2. The driver includes a first scanning line drive circuit 3, a second scanning line drive circuit 4, a data line drive circuit 5, a control circuit 6 and a power supply circuit 7. The first scanning line drive circuit 3 and the second scanning line drive circuit 4 are disposed, for example, respectively near both sides the display area 2 along a row direction X. The data line drive circuit 5, the control circuit 6, and the power supply circuit 7 are disposed near one side of the display area 2 along a column direction Y. The first scanning line drive circuit 3, the second scanning line drive circuit 4, and the data line drive circuit 5 are formed at least partially on a panel (not shown) which constitutes the display device 1.

The display area 2 comprises a plurality of pixels PX arranged in a matrix. In the display area, a plurality of first scanning lines WL (WL1 to WLm) and second scanning lines RL (RL1 to RLm) extending along the row direction X and a plurality of data lines DL (DL1 to DLn) extending in the column direction Y crossing the row direction X are formed so as to correspond to the pixels PXs, respectively. Note that m and n each represent a positive integer.

The thin film transistor 10 or 10a according to the first or second embodiment, respectively, may be applied to the switching elements contained in these pixels PX and various circuits included in the drivers.

Each of the first scanning lines WL is extended to the outside of the display area 2 and is electrically connected to the first scanning line drive circuit 3. Each of the second scanning lines RL is extended to the outside of the display area 2 and is electrically connected to the second scanning line drive circuit 4. Each of the data lines DL is extended to the outside of the display area 2 and is electrically connected to the data line drive circuit 5.

The first scanning line drive circuit 3 supplies write scanning signals WS sequentially to each of the first scanning lines WL. Thus, a plurality of pixel PXs arranged along the row direction X are sequentially selected.

The second scanning line drive circuit 4 supplies drive scanning signals AZ to each of the second scanning lines RL in synchronism with the write scanning signals WS supplied by the first scanning line drive circuit 3. Thus, the light emission and extinction of the pixels PX are controlled.

The data line drive circuit 5 supplies selectively, for example, a signal voltage Vsig or a reference voltage Vofs to the data lines DL. The signal voltage Vsig is the voltage of a signal according to the brightness of a video signal. The reference voltage Vofs is a voltage used as a standard of the signal voltage and is equivalent to the voltage of the signal which indicates a black level, for example. The reference voltage Vofs is used also to compensate the variation in threshold voltage of the drive transistors which drive the organic EL devices, which will be described later.

The control circuit 6 produces various signals necessary to display images on the display area 2 based on external signals supplied from an external signal source. The control circuit 6 outputs the thus produced various signals to the first scanning line drive circuit 3, the second scanning line drive circuit 4 and the data line drive circuit 5, respectively and controls the first scanning line drive circuit 3, the second scanning line drive circuit 4 and the data line drive circuit 5 to operate in synchronism with each other.

FIG. 8 is a circuit diagram schematically showing an example of a pixel PX.

The pixel PX comprises a write transistor Tr1, a drive transistor Tr2, a reset transistor Tr3, a capacitor Cs and a light-emitting device EL.

The write transistor Tr1, the drive transistor Tr2 and the reset transistor Tr3 are formed from the thin film transistor 10 or 10a according to the first or second embodiment.

A gate electrode 141 of the write transistor Tr1 is connected to the respective first scanning line WL, and a source electrode 19a1 is connected to the respective data line DL, and a drain electrode 19b1 is connected to a first electrode E1 of the capacitor Cs and a gate electrode 142 of the drive transistor Tr2.

A source electrode 19a2 of the drive transistor Tr2 is connected to a wiring line to which a power source voltage Vcc is supplied and a drain electrode 19b2 is connected to an anode EAN of the light emitting device EL, a second electrode E2 of the capacitor Cs and a source electrode 19a3 of the reset transistor Tr3. To a cathode ECT of the light emitting device EL, a cathode voltage Vcath is supplied.

A gate electrode 143 of the reset transistor Tr3 is connected to the respective second scanning line RL, and a drain electrode 19b3 is connected to a wiring line to which a fixed voltage Vini is supplied.

In the pixel PX of the above-described configuration, when a write scan signal WS is supplied to the first scanning line WL, the write transistor Tr1 is placed in a conduction state. In the conduction state, the write transistor Tr1 supplies the signal voltage Vsig or reference voltage Vofs supplied through the data line DL to the gate electrode 142 of the drive transistor Tr2. The capacitor Cs holds the signal voltage Vsig or the reference voltage Vofs. If the voltage held at the capacitor Cs exceeds a threshold voltage, the drive transistor Tr2 is set in an on state to supply the current based on the voltage held at the capacitor Cs to the light-emitting device EL. The light-emitting device EL emits light at a brightness corresponding to the current supplied from the drive transistor Tr2.

When a drive scanning signal AZ is supplied to the second scanning line RL, the reset transistor Tr3 is placed in a conduction state. In the conduction state, the reset transistor Tr3 supplies the fixed voltage Vini to, for example, a source electrode of the drive transistor Tr2 and the anode electrode of the light-emitting device EL, to reset (initialize) the voltages at these electrodes to the fixed voltage Vini. Here, when the threshold voltage of the light emitting device EL is defined as Vth, the relationship of the threshold voltage Vth, a cathode voltage Vcath and the fixed voltage Vini can be expressed by the following formula:

$$Vini < Vth + Vcath$$

Note that the display devices 1 may be, for example, a liquid crystal display including a liquid crystal layer as shown in FIG. 9. In the liquid crystal display, a pixel PX comprises a switching element SW, a pixel electrode PE, a common electrode CE, and liquid crystal element (liquid crystal layer) LC. The switching element SW is the thin film transistor 10 or 10a according to the first or second embodiment.

A gate electrode 14 of the switching element SW is connected to the respective scanning line WL, a source electrode 19a is connected to the respective data line DL, and a drain electrode 19b is connected to the pixel electrode PE. The pixel electrode opposes the common electrode CE which is disposed over a plurality of pixels PX. The liquid crystal molecules contained in the liquid crystal layer LC are aligned according to an electric field formed between the pixel electrode PE and the common electrode CE.

By applying the thin film transistor 10 or 10a according to the first or second embodiment to the display device 1 of the above-described configuration, the characteristics of the display device can be stabilized, the reliability can be improved and the yield can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin film transistor comprising:
a gate electrode above an insulating substrate;
a first insulating film on the gate electrode and the insulating substrate;
an oxide semiconductor layer on the first insulating film;
a second insulating film in a region on the oxide semiconductor layer, which corresponds to the gate electrode;
a first protective film on the oxide semiconductor layer and the second insulating film, as an insulating film containing a metal, the first protective film contacting a top surface of the second insulating film across an entirety of the top surface of the second insulating film;
a second protective film on the first protective film;
a third protective film on the second protective film, as an insulating film containing a metal;
an interlayer insulating film on the third protective film;
a pair of electrodes on the interlayer insulating film, and extending through the interlayer insulating film, the third protective film, the second protective film and the first protective film, to electrically connected to the oxide semiconductor layer.

2. The thin film transistor of claim 1, wherein
the third protective film is thicker than the first protective film.

3. The thin film transistors of claim 1, wherein
the first protective film and the third protective film include aluminum oxide.

4. The thin film transistor of claim 1, wherein
the second protective film includes at least one of silicon oxide, silicon nitride or silicon oxynitride.

5. A display device comprising the thin film transistor of claim 1.

6. The display device of claim 5, comprising an organic electroluminescence element.

7. The display device of claim 5, comprising a liquid crystal layer.

8. The thin film transistor of claim 1, wherein
the second protective film has a thickness greater than that of the third protective film.

9. A thin film transistor comprising:
an oxide semiconductor layer above an insulating substrate;
a first metal oxide layer on the oxide semiconductor layer;
a gate electrode above the insulating substrate;
a first insulating film between the gate electrode and the oxide semiconductor layer;
an inorganic insulating layer on the first metal oxide layer;
a second metal oxide layer on the inorganic insulating layer;

an interlayer insulating film on the second metal oxide layer; and a pair of electrodes on the interlayer insulating film, and extending through the interlayer insulating film, the second metal oxide layer, the inorganic insulating layer and the first metal oxide layer, to be electrically connected to the oxide semiconductor layer, wherein the first metal oxide layer is in contact with the oxide semiconductor layer, the inorganic insulating layer is in contact with the first metal oxide layer and the second metal oxide layer, and the pair of electrodes is in contact with the first metal oxide layer, the inorganic insulating layer and the second metal oxide layer.

10. The thin film transistor of claim 9, wherein the first metal oxide layer is in contact with an upper surface of the oxide semiconductor layer, the first insulating film, and an upper surface of the gate electrode.

11. The thin film transistor of claim 10, wherein the first metal oxide layer is in contact with the insulating substrate.

12. The thin film transistor of claim 9, wherein the gate electrode is between the first metal oxide layer and the oxide semiconductor layer.

13. A thin film transistor comprising:

an oxide semiconductor layer above an insulating substrate;

a first metal oxide layer on the oxide semiconductor layer;

an inorganic insulating layer on the first metal oxide layer;

a second metal oxide layer on the inorganic insulating layer;

an interlayer insulating film on the second metal oxide layer;

a pair of electrodes on the interlayer insulating film, and extending through the interlayer insulating film, the second metal oxide layer, the inorganic insulating layer and the first metal oxide layer, to be electrically connected to the oxide semiconductor layer;

a gate electrode between the oxide semiconductor layer and the insulating substrate;

a first insulating film between the gate electrode and the oxide semiconductor layer; and a second insulating film above the gate electrode and between the oxide semiconductor layer and the first metal oxide layer, wherein the inorganic insulating layer is in contact with the first metal oxide layer and the second metal oxide layer, the pair of electrodes is in contact with the first metal oxide layer, the inorganic insulating layer, and the second metal oxide layer, the first insulating film is in contact with the insulating substrate and an upper surface of the gate electrode, and the first metal oxide layer is in contact with an upper surface of the oxide semiconductor layer and an upper surface of the second insulating film.

14. A display device of claim 13, wherein the first metal oxide layer is in contact with the first insulating film.

* * * * *